(12) United States Patent
Anton et al.

(10) Patent No.: US 11,229,209 B2
(45) Date of Patent: Jan. 25, 2022

(54) COPPER-BASED ANTIMICROBIAL PVD COATINGS

(71) Applicant: VAPOR TECHNOLOGIES, INC., Longmont, CO (US)

(72) Inventors: Bryce Randolph Anton, Longmont, CO (US); Nicholas Peterson, Arvada, CO (US)

(73) Assignee: Vapor Technologies, Inc., Longmont, CO (US)

( * ) Notice: Subject to any disclaimer, the term of this patent is extended or adjusted under 35 U.S.C. 154(b) by 0 days.

(21) Appl. No.: 16/447,339

(22) Filed: Jun. 20, 2019

(65) Prior Publication Data

US 2020/0000096 A1 Jan. 2, 2020

Related U.S. Application Data

(60) Provisional application No. 62/690,781, filed on Jun. 27, 2018.

(51) Int. Cl.

| | |
|---|---|
| *A01N 59/20* | (2006.01) |
| *A01N 59/16* | (2006.01) |
| *B32B 15/01* | (2006.01) |
| *C23C 14/06* | (2006.01) |
| *C23C 28/02* | (2006.01) |
| *C23C 14/18* | (2006.01) |

(Continued)

(52) U.S. Cl.
CPC .............. *A01N 59/20* (2013.01); *A01N 59/16* (2013.01); *B32B 15/018* (2013.01); *C23C 14/0664* (2013.01); *C23C 14/185* (2013.01); *C23C 14/325* (2013.01); *C23C 14/35* (2013.01); *C23C 28/021* (2013.01); *Y10T 428/31678* (2015.04)

(58) Field of Classification Search
CPC ............ C23C 14/0658; C23C 14/0664; C23C 14/185; C23C 14/325; C23C 14/35; C23C 16/347; C23C 16/36; C23C 16/34; C23C 28/02; C23C 28/021; A01N 59/20; A01N 59/16; B32B 15/018; Y10T 428/12806; Y10T 428/12576; Y10T 428/12493; Y10T 428/31678; C22C 9/06
USPC ....... 428/660, 661, 457, 697, 698, 699, 701, 428/702
See application file for complete search history.

(56) References Cited

U.S. PATENT DOCUMENTS

| | | |
|---|---|---|
| 487,437 A | 12/1892 | Wagner |
| 637,657 A | 11/1899 | Pedersen |
| 5,326,808 A | 7/1994 | Floyd et al. |

(Continued)

FOREIGN PATENT DOCUMENTS

| | | |
|---|---|---|
| EP | 0611809 A2 | 8/1994 |
| WO | 2012/158703 A1 | 11/2012 |
| WO | 2013090341 A1 | 6/2013 |

OTHER PUBLICATIONS

Partial European Search Report dated Nov. 8, 2019 for EP Appn. No. 19182344.2, 15 pgs.

(Continued)

*Primary Examiner* — Catherine A. Simone
(74) *Attorney, Agent, or Firm* — Brooks Kushman P.C.

(57) ABSTRACT

A coated substrate includes a substrate, a zirconium-containing layer disposed over the substrate, and one or more copper alloy layers disposed over the substrate. Variations include coated substrate with a single copper alloy layer, alternating copper layers, or a combined copper alloy/zirconium-containing layer.

28 Claims, 4 Drawing Sheets

(51) Int. Cl.
*C23C 14/32* (2006.01)
*C23C 14/35* (2006.01)

(56) References Cited

U.S. PATENT DOCUMENTS

| | | | |
|---|---|---|---|
| 5,367,018 A | 11/1994 | Floyd et al. | |
| 5,470,906 A | 11/1995 | Craun et al. | |
| 5,530,056 A | 6/1996 | Farwaha et al. | |
| 5,610,225 A | 3/1997 | Farwaha et al. | |
| 5,708,077 A | 1/1998 | Nolken et al. | |
| 5,731,377 A | 3/1998 | Friel | |
| 6,020,416 A | 2/2000 | Mazur et al. | |
| 6,028,139 A | 2/2000 | Farwaha et al. | |
| 6,087,437 A | 7/2000 | Farwaha et al. | |
| 6,177,510 B1 | 1/2001 | Saam | |
| 6,376,570 B1 | 4/2002 | Zhao et al. | |
| 6,531,185 B1 | 3/2003 | Drujon et al. | |
| 7,049,357 B2 | 5/2006 | Craun et al. | |
| 7,157,526 B2 | 1/2007 | Nickolaus et al. | |
| 7,435,777 B2 | 10/2008 | Bochnik et al. | |
| 8,066,854 B2 | 11/2011 | Storey et al. | |
| 8,507,579 B2 | 8/2013 | Sheerin et al. | |
| 8,530,056 B2 | 9/2013 | Pilloy et al. | |
| 9,107,981 B2 | 8/2015 | Neumann et al. | |
| 2003/0207026 A1 | 6/2003 | Wesch et al. | |
| 2009/0149591 A1 | 6/2009 | Yang et al. | |
| 2009/0162695 A1 | 6/2009 | Hevesi et al. | |
| 2009/0198343 A1 | 8/2009 | Spain et al. | |
| 2010/0227156 A1* | 9/2010 | Satoh | C23C 28/341 428/332 |
| 2010/0255338 A1 | 10/2010 | Hayakawa et al. | |
| 2011/0152439 A1 | 6/2011 | Wu et al. | |
| 2011/0296873 A1* | 12/2011 | Derrig | A44C 27/006 63/15 |
| 2012/0034487 A1* | 2/2012 | Chang | C23C 14/0664 428/623 |

OTHER PUBLICATIONS

Extended European Search Report dated Feb. 20, 2020 for EP 19182344.2 filed Jun. 25, 2019, 12 pgs.
Reiners, G. et al., "Decorative Optical Coatings," Thin Solid Films, v. 253, No. 1-2, 1994, pp. 33-40.

* cited by examiner

COPPER-BASED ANTIMICROBIAL PVD COATINGS

CROSS-REFERENCE TO RELATED APPLICATIONS

This application claims the benefit of U.S. provisional application Ser. No. 62/690,781 filed Jun. 27, 2018, the disclosure of which is hereby incorporated in its entirety by reference herein.

TECHNICAL FIELD

In at least one aspect, the present invention is related to antibacterial coatings and in particular, to decorative coating having antibacterial properties.

BACKGROUND

The following patents and patent applications disclose variations of coatings that include copper: U.S. Pat. Nos. 9,107,981, 8,530,056, and 8,066,854 and U.S. Pat. Appl. No. 20090162695; 20090198343.

SUMMARY

In at least one aspect, a multilayer coating stack including a hard Zr-based base layer with a top coat having a copper alloy with antimicrobial characteristics is provided. The Zr-containing base layer can be color matched to be similar to that of the Cu alloy (which is available in a few shades—white bronze, rose copper and bronze). Advantageously, the harder base layer provides two functions: 1) increased durability and 2) when soft Cu alloy wears away, the harder layer will become visible and if the color difference is close, it will not be noticeable to the consumer. Variations include multilayer sandwiches of Cu/ZrCN/Cu/ZrCN or blended layers where there is co-deposition of materials. Moreover, alternate Cu alloys can be produced using different metals that are not currently offered, such as Zr, W, Cr, etc. these alternate alloy elements could result in different colors and physical properties.

Advantageously, copper base alloys are available on market (e.g., from CuVerro) that can be used to fabricate the various products of the present invention. In one variation, physical vapor deposition (PVD) deposits from a target made of this alloy can provide a thin-film for products that cannot be formed by the alloy itself. Other aspects of the invention relate to improving durability and functionality of a soft copper alloy.

DETAILED DESCRIPTION

Figure 1:
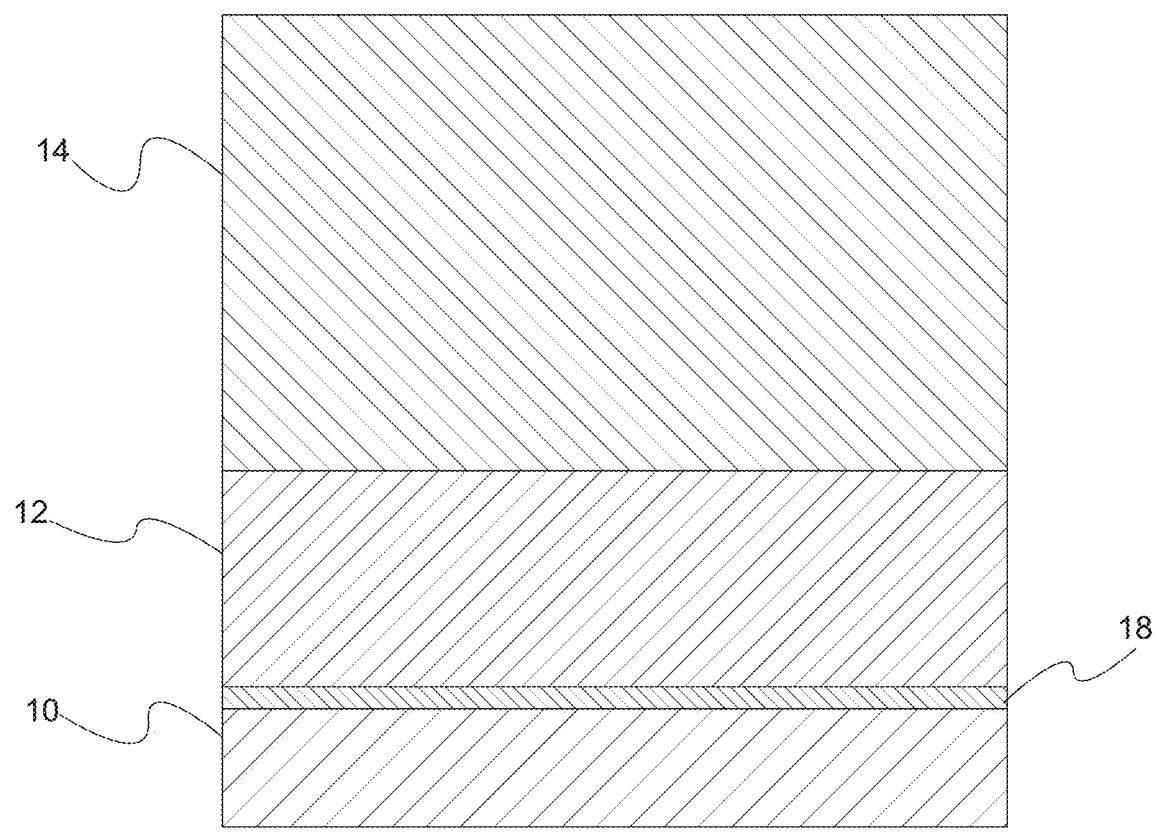
FIG. 1 is a schematic of a coated substrate having an outer copper alloy layer.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1 to 2.1 the following numbers 1.2, 1.3, 1.4, 1.5, 1.6, 1.7, 1.8, 1.9, and 2.0 can be selected as lower or upper limits.

In the examples set forth herein, concentrations, temperature, and reaction conditions (e.g., pressure, pH, flow rates, etc.) can be practiced with plus or minus 50 percent of the values indicated rounded to or truncated to two significant figures of the value provided in the examples. In a refinement, concentrations, temperature, and reaction conditions (e.g., pressure, pH, flow rates, etc.) can be practiced with plus or minus 30 percent of the values indicated rounded to or truncated to two significant figures of the value provided in the examples. In another refinement, concentrations, temperature, and reaction conditions (e.g., pressure) can be practiced with plus or minus 10 percent of the values indicated rounded to or truncated to two significant figures of the value provided in the examples.

Throughout this application, where publications are referenced, the disclosures of these publications in their entireties are hereby incorporated by reference into this application to more fully describe the state of the art to which this invention pertains.

Abbreviations:

"SCCM" means standard cubic centimeters per minute

In one embodiment, a coated substrate that includes a copper-containing alloy is provided. The coated substrate includes a substrate, a zirconium-containing base layer disposed over the substrate, and one or more (i.e., or a plurality of) copper alloy layers disposed over the zirconium-containing base layer. The zirconium-containing base layer is either a zirconium carbonitride base layer or a zirconium nitride base layer. In one variation, each copper alloy layer includes copper and nickel. Typically, each copper alloy includes nickel in an amount from about 8 to 28 weight percent of the total weight of the copper alloy layer with the copper being present in an amount form about 72 to 92 weight percent of the total weight of the copper alloy layer. In a refinement, each copper alloy layer includes nickel in an amount from about 10 to 25 weight percent of the total weight of the copper alloy layer and copper in an amount form about 75 to 90 weight percent of the total weight of the copper alloy layer. In some variations, each copper alloy layer can independently include additional elements such as iron, zirconium, tungsten, chromium, and combinations thereof. In a refinement, each of these additional elements are independently present in an amount from about 0.01 to about 5 weight percent of the total weight of the copper alloy layer. In a refinement, each of these additional elements are independently present in an amount from about 0.01 to about 5 weight percent of the total weight of the copper alloy layer. Examples of copper alloys are CuVerro White Bronze and CuVerro® Rose commercially available from Olin Brass located in Louisville, Ky.

Typically, the zirconium-containing base layer includes zirconium, carbon and nitrogen where zirconium is present in an amount of at least 50 mole percent with each of the carbon and nitrogen present in an amount of at least 0.02 and 0.1 mole percent, respectively. In a refinement, the zirconium-containing base layer includes a compound having the following formula:

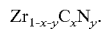

where x is 0.0 to 0.3 and y is 0.1 to 0.5. In a refinement, x is 0.0 to 0.2 and y is 0.2 to 0.3. In another refinement, x is at least in increasing order of preference 0.0, 0.02, 0.03, 0.04, 0.05, 0.07, or 0.09 and at most in increasing order of preference, 0.5, 0.4, 0.3, 0.25, 0.2, 0.15, or 0.11. Similarly, in this refinement, y is at least in increasing order of preference 0.1, 0.15, 0.2, 0.25, 0.27, or 0.29 and at most in increasing order of preference, 0.6, 0.5, 0.40, 0.35, 0.33, or 0.31. In a further refinement, the zirconium-containing base layer includes zirconium carbonitride described by $Zr_{0.60}C_{0.10}N_{0.30}$.

The substrate used herein can virtually include any solid substrate. Examples of such substrates include metal substrates, plastic substrates, and glass substrates. In one variation, the substrate is not glass. In some variations the substrate is pre-coated with a metal adhesion layer. Such metal adhesion layers include metals such as chromium, nickel, tungsten, zirconium, and combinations thereof. Although any thickness for the adhesion layer can be used, useful thicknesses are from 100 nm to 0.2 microns.

Figure 2:
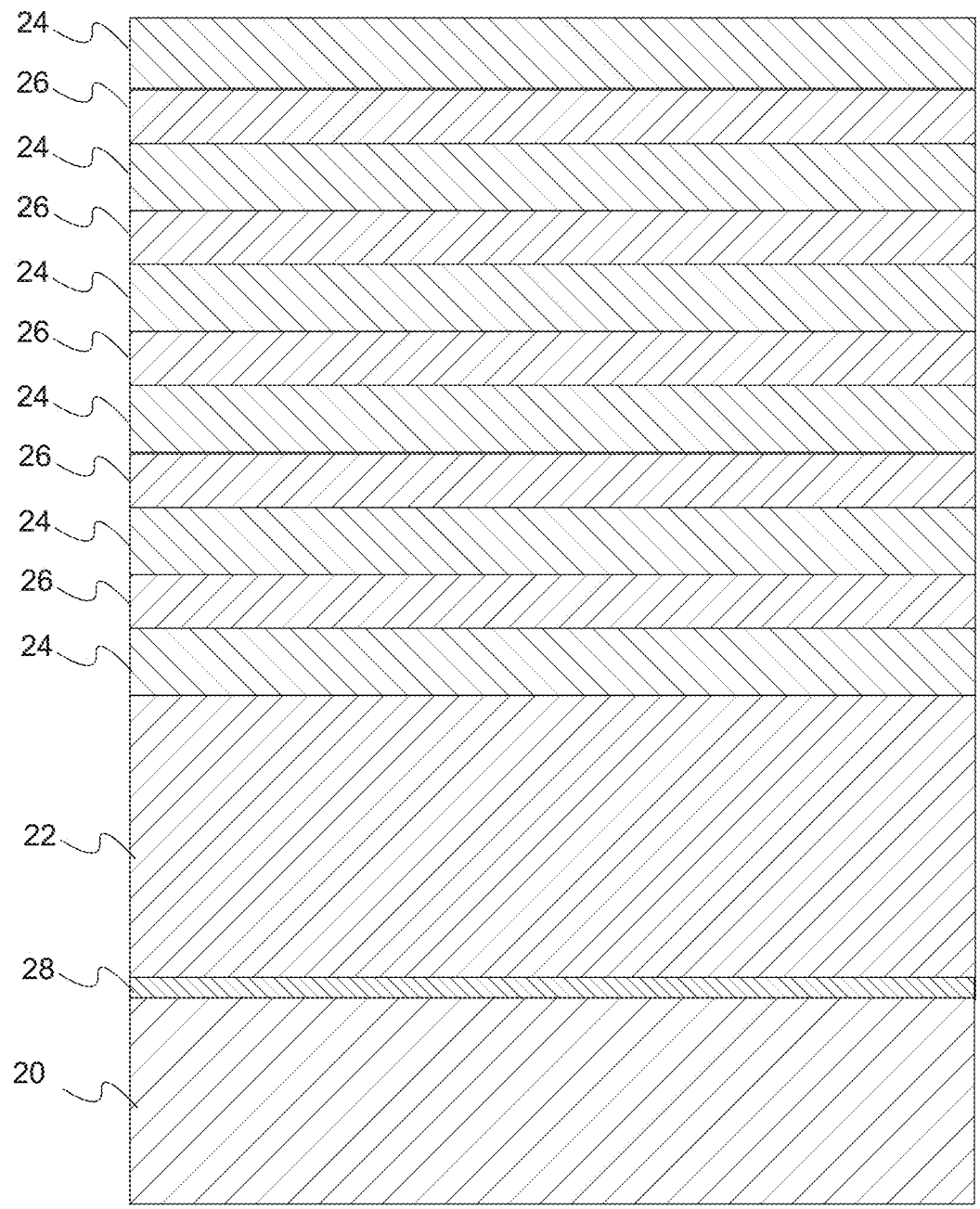
FIG. 2 is a schematic of a coated substrate having alternating zirconium-containing and copper alloy layers.
Figure 3:
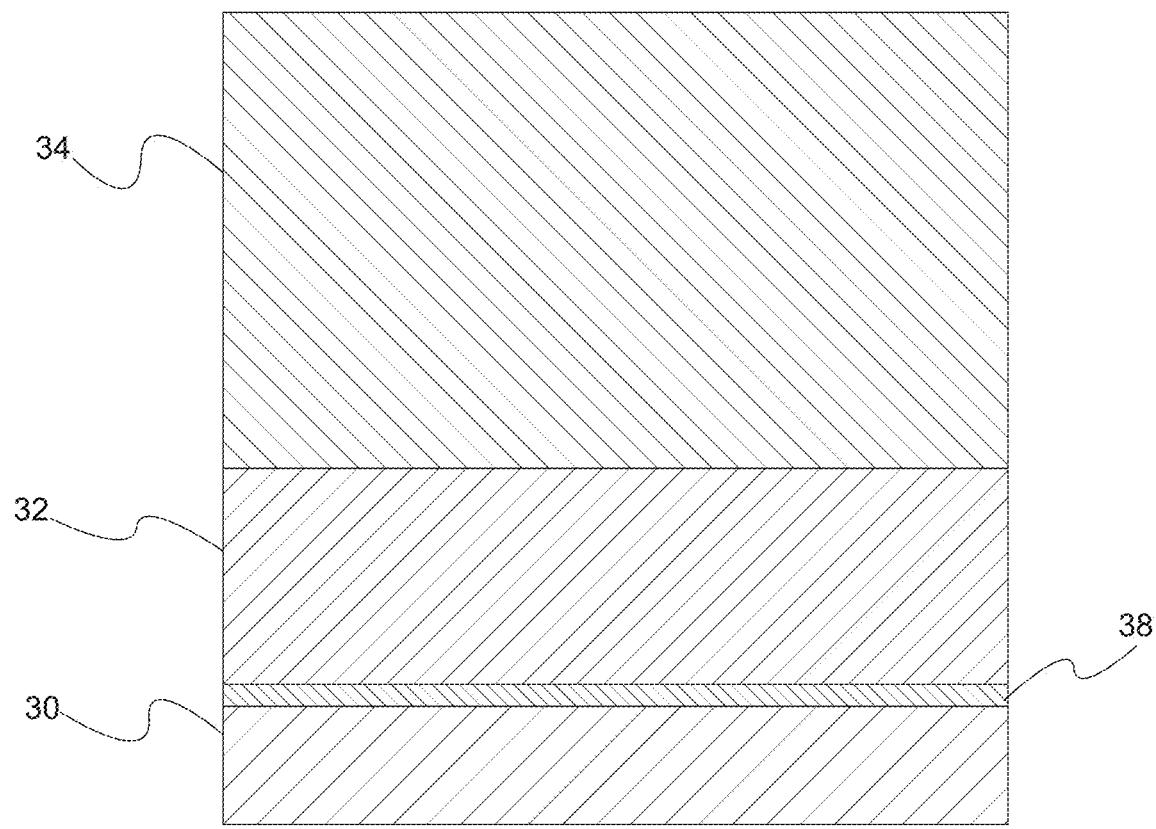
FIG. 3 is a schematic of a coated substrate having an outer mixed zirconium copper alloy layer.

FIGS. 1, 2, and 3 provide different configurations for the coated substrate with the zirconium-containing base layer and copper alloy layers set forth above. FIG. 1 provides an example in which the one or more copper alloy layers are a single layer. In this example, substrate 10 is coated with zirconium-containing base layer 12 which is over coated with copper alloy layer 14. In a refinement, optional metal adhesion layer 18 is interposed between substrate 10 and zirconium-containing layer 12. In another refinement, zirconium-containing base layer 12 typically has a thickness from about 100 to 800 nm, copper alloy layer 14 typically has a thickness from about 50 to 600 nm, and metal adhesion layer 18 when present has a thickness from about 10 to 200 nm. In still another refinement, zirconium-containing base layer 12 typically has a thickness from about 200 to 400 nm, copper alloy layer 14 typically has a thickness from about 100 to 300 nm, and metal adhesion layer 18 when present has a thickness from about 20 to 80 nm.

With reference to FIG. 2, a schematic illustration of a coated substrate having alternating copper alloy layers and zirconium-containing layers. In this example, substrate 20 is coated with zirconium-containing base layer 22 which is over coated with alternating copper alloy layers 24 and zirconium-containing interlayers 26. The zirconium-containing interlayers are either zirconium carbonitride interlayers or zirconium nitride interlayers. In a variation, the coated substrate includes 3 to 10 copper alloy layers and 3 to 10 zirconium-containing interlayers. In a refinement, optional metal adhesion layer 28 is interposed between substrate 20 and zirconium-containing base layer 22. Zirconium-containing base layer 22 and zirconium-containing interlayers 26 each typically has a thickness from about 40 to 150 nm while copper alloy layer 14 typically has a thickness from about 20 to 80 nm. Metal adhesion layer 28 when present has a thickness from about 20 to 80 nm. In this variation, zirconium-containing base layer 22 and zirconium-containing interlayers 26 each independently have the formulae for zirconium-containing set forth above.

With reference to FIG. 3, a schematic illustration of a coated substrate having a blended zirconium copper alloy layer. In this example, substrate 30 is coated with zirconium-containing base layer 32 which is over coated with a blended zirconium copper alloy layer 34. In a refinement, blended zirconium copper alloy layer 34 is a blended zirconium-containing/copper alloy layer (i.e., it includes both zirconium carbonitride and copper alloy blended together). In a variation, zirconium-containing base layer 32 is absent. In another refinement, optional metal adhesion layer 38 is interposed between substrate 30 and zirconium-containing base layer 32 or blended zirconium copper alloy layer 34 if zirconium-containing base layer 32 is absent. Zirconium-containing base layer 32 when present typically has a thickness from about 20 to 300 nm, blended zirconium copper alloy layer 34 typically has a thickness from about 50 to 600 nm, and metal adhesion layer 38 when present has a thickness from about 10 to 200 nm. In a refinement, zirconium-containing base layer 32 when present typically has a thickness from about 40 to 150 nm, blended zirconium copper alloy layer 34 typically has a thickness from about 100 to 300 nm and metal adhesion layer 38 when present has a thickness from about 20 to 80 nm.

Figure 4:
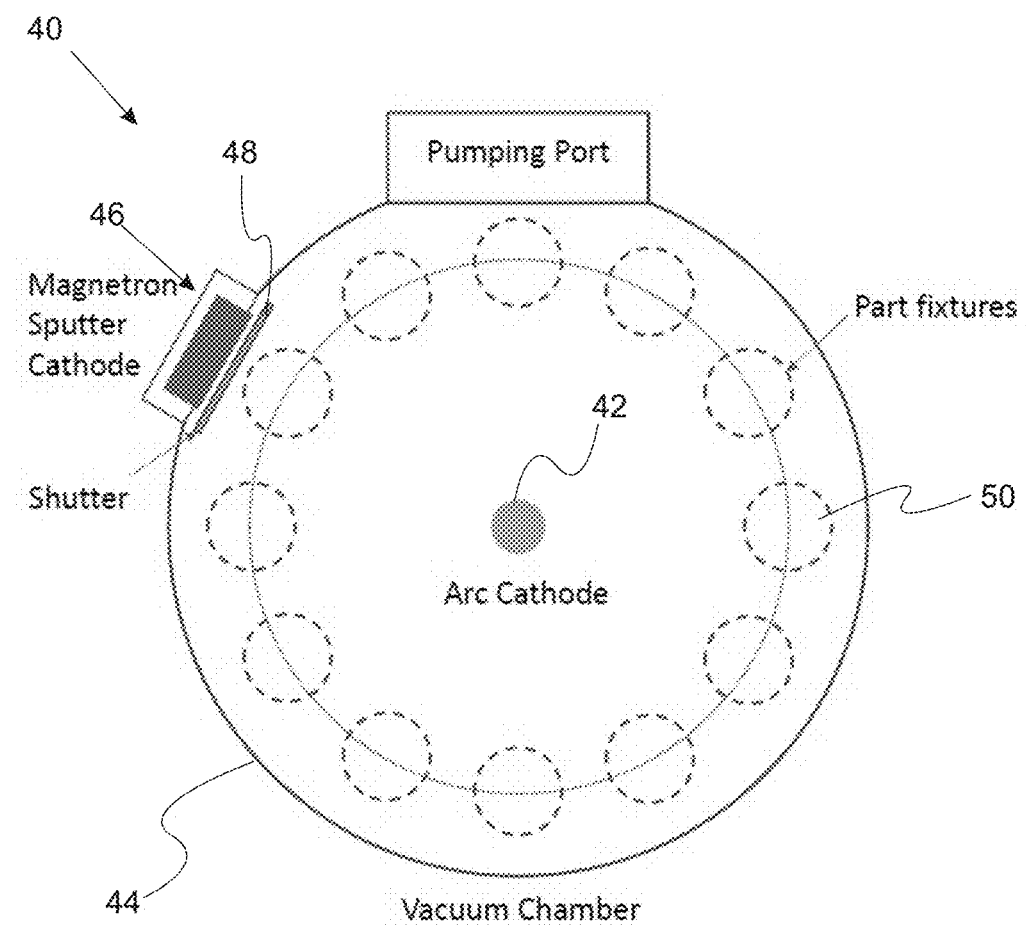
FIG. 4 provides a schematic illustration of a coating system that can be use to for form the multilayer coatings provided herein.

With reference to FIG. 4, a schematic illustration of a coating system that can be used to form the coated substrates set forth above is provided. Coating system 40 includes arc source 42 disposed within vacuum chamber 44. Arc source 42 is used to deposit the metal adhesion layer and the zirconium-containing layer set forth above. Coating system 40 also includes magnetron sputter source 46 for depositing the copper alloy layers and associated shutter 48. Shutter 48 control the availability of magnetron sputter source 46, opening when a copper alloy layer is deposited and closed otherwise. Substrate 50 are also disposed with vacuum chamber 44 typically moving about arc source 42.

The following examples illustrate the various embodiments of the present invention. Those skilled in the art will recognize many variations that are within the spirit of the present invention and scope of the claims.

Example 1 (Bilayer)

A vacuum thin film deposition chamber is pumped down to a pressure of $2.0 \times 10^{-5}$ Torr. The chamber is then heated to a temperature of 150° C. using wall mounted resistive heating elements. On a carousel inside the chamber, chromium electroplated brass door handles are mounted on racks that rotate in a 2-axis planetary motion in between a wall mounted magnetron sputtering cathode and a centrally located cylindrical arc cathode. An ion etch surface preparation is carried out by backfilling with Argon gas to a pressure of 25.0 mTorr and a bias voltage of −500V is applied to parts. A Zirconium metal adhesion layer is applied to the handle parts by striking an arc on the arc cathode at a current of 400 A. The chamber is backfilled by Argon to a pressure of 3.0 mTorr and a substrate bias of −100V is applied. This step lasts 3 minutes to build a layer of 50 nm thick Zr metal. A second coating layer comprised of a Zirconium Carbonitride, is applied by continuing to run the arc on the Zr target but adding Nitrogen and Methane gas at flows of 80 sccm and 20 sccm, respectively to for a composition of approximately $Zr_{0.60}C_{0.10}N_{0.30}$. This layer is built up to 300 nm in 25 minutes at which point the Zr arc cathode is turned off and the Nitrogen and Methane gases are shut off, leaving only Argon to continue to flow at a pressure of 3.0 mTorr. A shutter to the wall mounted magnetron sputtering cathode is opened, revealing a target comprised of C706 copper alloy material. The cathode is powered to a level of 10 kW for a duration of 30 minutes to result in a layer thickness of 200 nm. The resulting film is a total of 550 nm thick.

Example 2 (Multi-Layer)

A vacuum thin film deposition chamber is pumped down to a pressure of $2.0 \times 10^{-5}$ Torr. The chamber is then heated to a temperature of 150° C. using wall mounted resistive heating elements. On a carousel inside the chamber, stainless steel panels are mounted on racks that rotate in a 2-axis planetary motion in between a wall mounted magnetron sputtering cathode and a centrally located cylindrical arc cathode. An ion etch surface preparation is carried out by backfilling with Argon gas to a pressure of 25.0 mTorr and a bias voltage of −500V is applied to parts. A Zirconium metal adhesion layer is applied to the panels by striking an arc on the arc cathode at a current of 400 A. The chamber is backfilled by Argon to a pressure of 3.0 mTorr and a substrate bias of −100V is applied. This step lasts 3 minutes to build a layer of 50 nm thick Zr metal. A second coating layer comprised of a Zirconium Carbonitride, is applied by continuing to run the arc on the Zr target but adding Nitrogen and Methane gas at flows of 80 sccm and 20 sccm, respectively to for a composition of approximately $Zr_{0.60}C_{0.10}N_{0.30}$. This layer is built up to 60 nm in 5 minutes at which point the Zr arc cathode is turned off and the Nitrogen and Methane gases are shut off, leaving only Argon to continue to flow at a pressure of 3.0 mTorr. A shutter to the wall mounted magnetron sputtering cathode is opened, revealing a target comprised of C706 copper alloy material. The cathode is powered to a level of 10 kW for a duration of 6 minutes to result in a layer thickness of 40 nm. These last two layers are repeated four more times tow build up to 10 total alternating layers. The resulting film is a total of 550 nm thick.

Example 2 (Blended)

A vacuum thin film deposition chamber is pumped down to a pressure of $2.0 \times 10^{-5}$ Torr. The chamber is operated at room temperature. On a carousel inside the chamber, Cr plated ABS plastic trim parts are mounted on racks that rotate in a 2-axis planetary motion in between a wall mounted magnetron sputtering cathode and a centrally located cylindrical arc cathode. An ion etch surface preparation is carried out by backfilling with Argon gas to a pressure of 25.0 mTorr and a bias voltage of −500V is applied to parts. A Zirconium metal adhesion layer is applied to the panels by striking an arc on the arc cathode at a current of 300 A. The chamber is backfilled by Argon to a pressure of 3.0 mTorr and a substrate bias of −50V is applied. This step lasts 3 minutes to build a layer of 40 nm thick Zr metal. A second coating layer comprised of a mix of Cu alloy and Zirconium Carbonitride, is applied by continuing to run the arc on the Zr target but adding Nitrogen and Methane gas at flows of 80 sccm and 20 sccm, respectively to for a composition of approximately $Zr_{0.60}C_{0.10}N_{0.30}$. A shutter to the wall mounted magnetron sputtering cathode is opened, revealing a target comprised of C706 copper alloy material. The cathode is powered to a level of 10 kW. Both the Zr arc target and the Cu alloy sputter target run for 10 minutes to result in a coating layer thickness of 160 nm. The resulting film is 200 nm thick.

Table 1 provides color measurements were taken using a Minolta spectrophotometer using CIELAB color space with D65 light source and 10 degree observer angle for coated substrates based on copper alloy and ZrCN. Variations of the coated substrates set forth above have color coordinates that are plus or minus 10 percent of the values in Table 1.

TABLE 1

Color coordinates for coated sample.

| | L* | a* | b* |
|---|---|---|---|
| C706 copper alloy (Rose Gold) | 76.3 | 7.46 | 20.8 |
| C710 (White Bronze) | 80.3 | 2.50 | 10.4 |
| ZrCN (Rose Gold) | 69.7 | 9.26 | 21.3 |
| ZrCN (White Bronze) | 75.2 | 2.23 | 10.0 |

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:
1. A coated substrate comprising:
a substrate;
a zirconium-containing base layer disposed over the substrate, the zirconium-containing base layer being a zirconium carbonitride base layer or a zirconium nitride base layer wherein the zirconium-containing base layer includes a compound having formula:

$$Zr_{1-x-y}C_xN_y,$$

where x is 0.0 to 0.3 and Y is 0.1 to 0.5; and
one or more copper alloy layers disposed over and contacting the zirconium-containing base layer; and
a metal adhesion layer interposed between the substrate and the zirconium-containing base layer, the metal adhesion layer having a thickness from about 20 to 80 nm, wherein the one or more copper alloy layers are color matched to the zirconium-containing base layer.

2. The coated substrate of claim 1 wherein the zirconium-containing base layer includes zirconium in an amount of at least 50 mole percent, carbon in an amount of at least 0.02 mole percent, and nitrogen in an amount of at least 0.02 mole percent.

3. The coated substrate of claim 1 wherein the zirconium-containing base layer includes a compound having formula:

$$Zr_{1-x-y}C_xN_y$$

where x is 0.0 to 0.2 and Y is 0.2 to 0.3.

4. The coated substrate of claim 1 wherein the zirconium-containing base layer includes zirconium carbonitride having formula $Zr_{0.60}C_{0.10}N_{0.30}$.

5. The coated substrate of claim 1 wherein each copper alloy layer includes copper and nickel.

6. The coated substrate of claim 5 wherein nickel is present in an amount from about 10 to 25 weight percent of the total weight of each copper alloy layer with copper being present in an amount from about 75 to 90 weight percent of the total weight of each copper alloy layer.

7. The coated substrate of claim 1 wherein each copper alloy layer includes additional elements selected from the group consisting of iron, zirconium, tungsten, chromium, and combinations thereof.

8. The coated substrate of claim 7 wherein each of the additional elements are independently present in an amount from about 0.01 to about 5 weight percent of the total weight of the copper alloy layer.

9. The coated substrate of claim 1 wherein a single copper alloy layer is disposed over the zirconium-containing base layer.

10. The coated substrate of claim 1 wherein the zirconium-containing base layer has a thickness from about 100 to 800 nm and a single copper alloy layer has a thickness from about 50 to 600 nm.

11. The coated substrate of claim 1 having alternating copper alloy layers and zirconium-containing interlayers disposed over the zirconium-containing base layer, the zirconium-containing interlayers being zirconium carbonitride interlayers or zirconium nitride interlayers.

12. The coated substrate of claim 11 wherein the zirconium-containing base layer and the zirconium-containing interlayers each independently have a thickness from about 20 to 300 nm and each copper alloy layer has a thickness from about 10 to 200 nm.

13. The coated substrate of claim 1 having 3 to 10 copper alloy layers and 3 to 10 zirconium-containing interlayers.

14. The coated substrate of claim 1 wherein the metal adhesion layer is zirconium.

15. A coated substrate comprising:
a substrate;
a zirconium-containing base layer disposed over the substrate, the zirconium-containing base layer being a zirconium carbonitride base layer or a zirconium nitride base layer wherein the zirconium-containing base layer includes a compound having formula:

$$Zr_{1-x-y}C_xN_y,$$

where x is 0.0 to 0.3 and Y is 0.1 to 0.5;
blended zirconium copper alloy layer disposed over the zirconium-containing base layer; and
a metal adhesion layer interposed between the substrate and the zirconium-containing base layer, the metal adhesion layer having a thickness from about 20 to 80 nm.

16. The coated substrate of claim 15 wherein blended zirconium copper alloy layer is a blended zirconium-containing/copper alloy layer.

17. The coated substrate of claim 15 wherein blended zirconium copper alloy layer has a thickness from about 50 to 600 nm.

18. A coated substrate comprising:
a substrate;
a zirconium-containing base layer disposed over the substrate, the zirconium-containing base layer being a zirconium carbonitride base layer or a zirconium nitride base layer; and
one or more copper alloy layers disposed over the zirconium carbonitride base layer, each copper alloy layer including copper and nickel wherein nickel is present in an amount from about 10 to 25 weight percent of the total weight of each copper alloy layer with copper being present in an amount from about 75 to 90 weight percent of the total weight of each copper alloy layer; and
a metal adhesion layer interposed between the substrate and the zirconium-containing base layer, the metal adhesion layer having a thickness from about 20 to 80 nm.

19. The coated substrate of claim 18 wherein the zirconium-containing base layer includes zirconium in an amount of at least 50 mole percent, carbon in an amount of at least 0.02 mole percent, and nitrogen in an amount of at least 0.02 mole percent.

20. The coated substrate of claim 18 wherein the zirconium-containing base layer includes a compound having formula:

$$Zr_{1-x-y}C_xN_y,$$

where x is 0.0 to 0.2 and Y is 0.2 to 0.3.

21. The coated substrate of claim 18 wherein the zirconium-containing base layer includes zirconium carbonitride having formula $Zr_{0.60}C_{0.10}N_{0.30}$.

22. The coated substrate of claim 18 wherein each copper alloy layer includes additional elements selected from the group consisting of iron, zirconium, tungsten, chromium, and combinations thereof.

23. The coated substrate of claim 22 wherein each of the additional elements are independently present in an amount from about 0.01 to about 5 weight percent of the total weight of the copper alloy layer.

24. The coated substrate of claim 18 wherein a single copper alloy layer is disposed over the zirconium-containing base layer.

25. The coated substrate of claim 18 wherein the zirconium-containing base layer has a thickness from about 100 to 800 nm and a single copper alloy layer has a thickness from about 50 to 600 nm.

26. The coated substrate of claim 18 having alternating copper alloy layers and zirconium-containing interlayers disposed over the zirconium-containing base layer, the zirconium-containing interlayers being zirconium carbonitride interlayers or zirconium nitride interlayers.

27. The coated substrate of claim 26 wherein the zirconium-containing base layer and the zirconium-containing interlayers each independently have a thickness from about 20 to 300 nm and each copper alloy layer has a thickness from about 10 to 200 nm.

28. The coated substrate of claim 18 having 3 to 10 copper alloy layers and 3 to 10 zirconium-containing interlayers.

* * * * *